United States Patent [19]

Lai

[11] 4,224,533
[45] Sep. 23, 1980

[54] EDGE TRIGGERED FLIP FLOP WITH MULTIPLE CLOCKED FUNCTIONS

[75] Inventor: Eric H. Lai, Cupertino, Calif.

[73] Assignee: Signetics Corporation, Sunnyvale, Calif.

[21] Appl. No.: 931,596

[22] Filed: Aug. 7, 1978

[51] Int. Cl.² .................... H03K 5/13; H03K 3/353; H03K 17/18; H03K 17/26
[52] U.S. Cl. ................ 307/247 R; 307/243; 307/269; 307/279; 328/48
[58] Field of Search ............. 307/247 R, 243, 272 A, 307/279, 289, 291, 220 C, 225 C, 269; 328/48

[56] References Cited

U.S. PATENT DOCUMENTS

| | | | |
|---|---|---|---|
| 3,363,115 | 1/1968 | Stephenson et al. | 307/220 C X |
| 3,424,928 | 1/1969 | Priel et al. | 307/289 X |
| 3,430,070 | 2/1969 | Marshall, Jr. et al. | 307/272 A X |
| 3,624,423 | 11/1971 | Borgini | 307/279 |
| 3,812,388 | 5/1974 | Southworth | 307/247 R X |
| 3,854,059 | 12/1974 | Nomiya et al. | 307/279 X |
| 3,895,240 | 7/1975 | Kawagoe | 307/279 |
| 3,953,839 | 4/1976 | Dennison et al. | 307/238 X |
| 3,993,919 | 11/1976 | Cox et al. | 307/279 |
| 4,133,611 | 1/1979 | Baker | 307/279 X |

FOREIGN PATENT DOCUMENTS 2603555 8/1976 Fed. Rep. of Germany ........... 307/279

OTHER PUBLICATIONS

Pomeranz, "Complementary Metal-Oxide Semiconductor J-K Flip-Flop & Shift Cell"; *IBM Tech. Discl. Bull.;* vol. 16, No. 11, pp. 3613-3614; 4/74.
MacFarlane, "Pulse Generator and Flip-Flops"; *IEEE Trans. on Instrumentation & Measurement;* vol. IM-21, No. 2, pp. 148-153; 5/72.

*Primary Examiner*—Larry N. Anagnos
*Attorney, Agent, or Firm*—Jerry A. Dinardo; William H. Dana; Jack Oisher

[57] ABSTRACT

A single flip flop is integrated with MOS circuitry which enables the single flip flop to be triggered by each of several individual clocked functions without interfering with one another. The flip flop responds only to low to high transitions of each clock signal input. This is accomplished by feeding back the flip flop output to each trigger circuit in such a way as to temporarily disconnect the trigger circuit from the flip flop during the time period between two successive low to high transitions of a particular clock signal, so that the flip flop can be triggered by other clocked functions without interference from the particular clock signal.

8 Claims, 2 Drawing Figures

EDGE TRIGGERED FLIP FLOP WITH MULTIPLE CLOCKED FUNCTIONS

BACKGROUND OF THE INVENTION

This invention relates to edge triggered flip flops and more particularly to a circuit arrangment for integrating into a single flip flop multiple clocked functions that would normally require multiple flip flops.

In logic design many flip flops require set and/or reset functions triggered by different clocks. Conventionally, this would be accomplished by setting and resetting individual flip flops for each function and then merging all these flip flop outputs together into a single flip flop. This requires complicated circuitry and increased circuit area.

SUMMARY OF THE INVENTION

The foregoing disadvantages are avoided by means of the greatly simplified circuitry of the invention. According to the invention, a single flip flop is integrated with circuitry which enables the single flip flop to be triggered by each of several individual clocked functions without interfering with one another.

A flip flop is arranged in a circuit which includes trigger circuit means for controlling the flip flop and having a clock input and at least one of a set input and a reset input. Thus the trigger circuit means have either a set input with a clock input, or a reset input with a clock input, or both a set input and a reset input with a clock input. The trigger circuit means are coupled to the flip flop so that during the application of a set signal to the set input, the occurrence of a first low to high logic level transition of a clock signal applied to the clock input will set the flip flop to one state; and during the application of a reset signal to reset input, the occurrence of a second low to high logic level transition of the clock signal will set the flip flop to another state opposite to said one state. In addition, means are provided coupled between the flip flop and the trigger circuit means to temporarily disconnect the trigger circuit means from the flip flop during the time period between two successive low to high logic level transitions of the same clock signal, whereby the flip flop can be controlled during the last mentioned time period by coupling another trigger circuit means to the flip flop.

DESCRIPTION OF THE PREFERRED EMBODIMENT

Figure 1:
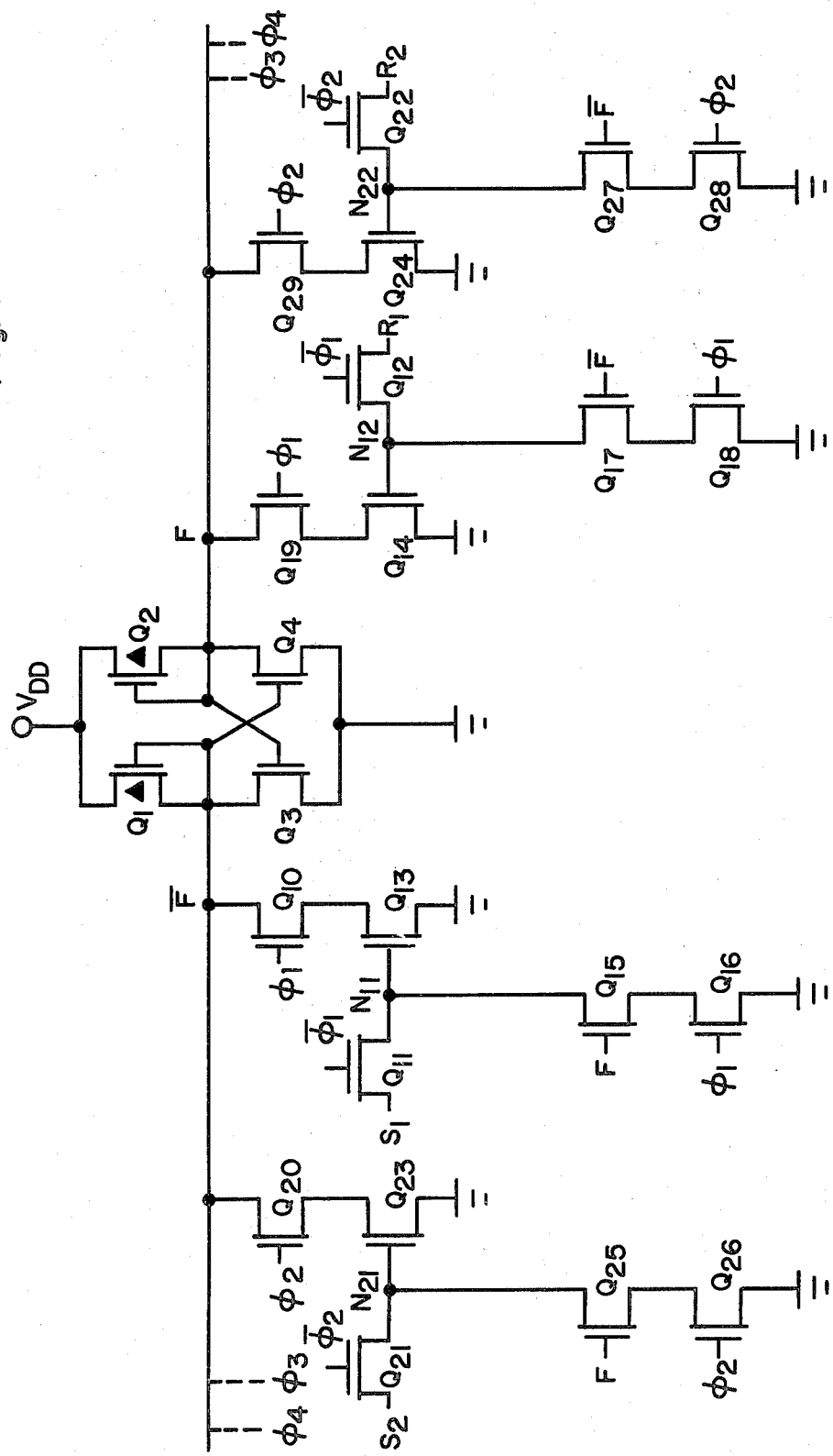
FIG. 1 is a schematic diagram of an edge triggered flip flop arranged to be triggered by multiple clocked functions in accordance with the invention.

Referring now to FIG. 1, only two clocked functions are shown, for simplicity. The first function is $S_1$ and $R_1$ set and reset, clocked by $\phi_1$ and $\overline{\phi_1}$ complementary clock inputs. The second function is $S_2$ and $R_2$ set and reset, clocked by $\phi_2$ and $\overline{\phi_2}$ complementary clock inputs. The circuitry is shown implemented with metal-oxide-semiconductor field effect transistors (MOSFET). Thus, transistors $Q_1$, $Q_2$, $Q_3$, $Q_4$ form a cross-coupled latch or flip flop. A first load transistor $Q_1$ is connected in series with a first driver transistor $Q_3$, and a second load transistor $Q_2$ is connected in series with a second driver transistor $Q_4$. The sources of the driver transistors $Q_3$ and $Q_4$ are connected together to ground. The drains of the load transistors $Q_1$ and $Q_2$ are connected together to a positive voltage supply $V_{DD}$.

The gate of the first driver transistor $Q_3$ is connected to the gate of the second load transistor $Q_2$ and to a common output node F. The drain of the second driver transistor $Q_4$ and the source of the second load transistor $Q_2$ are also connected to the output node F.

The gate of the second driver transistor $Q_4$ is connected to the gate of the first load transistor $Q_1$ and to a second common output node or complementary output node $\overline{F}$. The drain of the first driver transistor $Q_3$ and the source of the first load transistor $Q_1$ are also connected to the complementary output node $\overline{F}$.

In the drawing, the solid triangle next to each of the load transistors $Q_1$ and $Q_2$ denotes that these transistors $Q_1$ and $Q_2$ are depletion type. All other transistors are enhancement type. The flip flop and the associated trigger circuit means are preferably implemented by the use of well proven N channel silicon gate depletion load MOS technology.

A pair of trigger circuits are shown coupled to the flip flop output nodes $\overline{F}$ and F respectively. One of the trigger circuits is used to set the flip flop and the other trigger circuit is used to reset the flip flop. The setting trigger circuit is coupled to the complementary output node $\overline{F}$ and includes two serially connected driver transistors $Q_{10}$ and $Q_{13}$. One driver transistor $Q_{10}$ receives a clock input $\phi_1$ on its gate, and has its drain connected to the complementary output node $\overline{F}$ and its source connected to the drain of the other driver transistor $Q_{13}$. The latter transistor $Q_{13}$ has its source grounded and its gate connected to a storage node $N_{11}$ in common with the source of a transfer transistor $Q_{11}$. The transfer transistor $Q_{11}$ receives a set signal $S_1$ on its drain and a complementary clock signal $\overline{\phi_1}$ on its gate.

In accordance with an important feature of the invention, two serially connected transistors $Q_{15}$ and $Q_{16}$ are coupled to the storage node $N_{11}$ and function to discharge the potential on that storage node $N_{11}$, thereby temporarily disconnecting the setting trigger circuit from the flip flop during the time period between two successive low to high logic level transitions of the first clock signal $\phi_1$, whereby the flip flop can be controlled by different clocked functions, such as $S_2$, $R_2$ clocked by $\phi_2$ and $\overline{\phi_2}$. The storage node $N_{11}$ is discharged by feeding the high level on output node F back to the gate of transistor $Q_{15}$ while the lock signal $\phi_1$ is applied to the gate of transistor $Q_{16}$.

The resetting trigger circuit is coupled to the node F and includes two serially connected driver transistors $Q_{19}$ and $Q_{14}$. One driver transistor $Q_{19}$ receives the clock signal input $\phi_1$ on its gate and has its drain connected to the output node F and its source connected to the drain of the other driver transistor $Q_{14}$. The latter transistor $Q_{14}$ has its source grounded and its gate connected to a storage node $N_{12}$ in common with the source of a transfer transistor $Q_{12}$. The transfer transistor $Q_{12}$ receives a reset signal $R_1$ on its drain and the complementary clock signal $\overline{\phi_1}$ on its gate.

Two transistors $Q_{17}$ and $Q_{18}$ are serially connected to the storage node $N_{12}$ so that node $N_{12}$ can be discharged by feeding the high level on the complementary output node $\overline{F}$ back to the gate of transistor $Q_{17}$ while the clock signal $\phi_1$ is applied to the gate of transistor $Q_{18}$.

Similarly, a second clocked function $S_2$ and $R_2$ clocked by $\phi_2$ and $\overline{\phi_2}$ includes set and reset trigger circuits which are identical to the ones already described. The set trigger circuit includes transistors $Q_{20}$, $Q_{21}$, $Q_{23}$, $Q_{25}$, $Q_{26}$, and the reset trigger circuit includes transistors $Q_{29}$, $Q_{22}$, $Q_{24}$, $Q_{27}$, $Q_{28}$.

The operation will now be described with the aid of the waveform diagram of FIG. 2. Let it first be assumed that output node F is low and output node $\overline{F}$ is high, clock signal $\phi_1$ is low and the clock signal $\overline{\phi}_1$ is high. When $S_1$ is driven high, the high level is transferred to storage node $N_{11}$ through the transfer transistor $Q_{11}$, which is turned on by the high logic level of $\overline{\phi}_1$. The high level on storage node $N_{11}$ turns on transistor $Q_{13}$, but transistor $Q_{10}$ is held off by $\phi_1$ being low, and therefore $\overline{F}$ remains high.

With output node $\overline{F}$ high and output node F low, transistor $Q_4$ is on, and transistor $Q_3$ is off.

Figure 2:
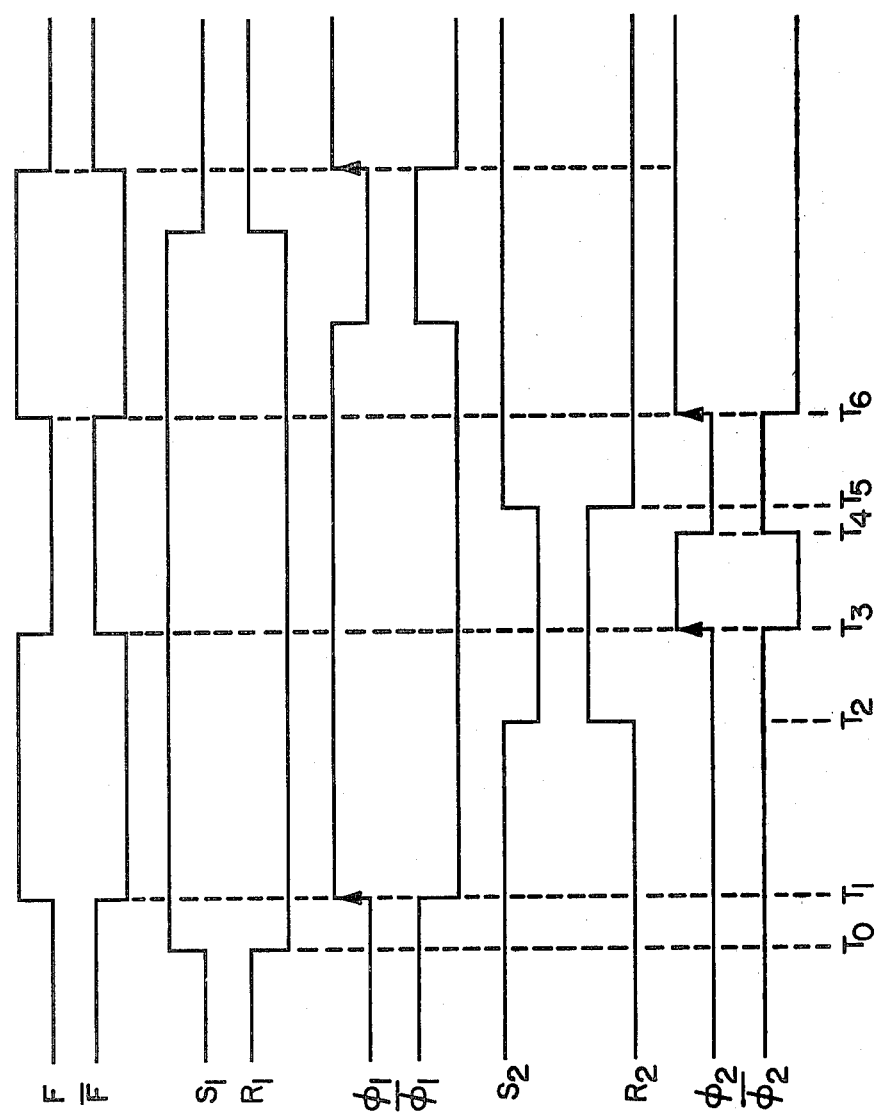
FIG. 2 is a timing diagram of waveforms associated with the circuitry of the invention.

The above describes the conditions occurring at time $T_0$ in FIG. 2.

F will remain high and F will remain low until the first clock signal $\phi_1$ goes high, at time $T_1$ shown in FIG. 2. When $\phi_1$ goes high, or in other words $\phi_1$ makes a low to high logic level transistion, it turns on transistor $Q_{10}$ in the setting trigger circuit. The complement of the clock signal, namely $\overline{\phi}_1$, goes low and turns off transistor $Q_{11}$, and the high logic level that was present at the storage node $N_{11}$ just before $\overline{\phi}_1$ went low is trapped at the storage node $N_{11}$. The complementary output node $\overline{F}$ is pulled low by both transistors $Q_{10}$ and $Q_{13}$ being on. Flip flop transistor $Q_4$ turns off, allowing the output node F to charge up, and by feedback action, flip flop transistor $Q_3$ turns on.

The flip flop is thus set with the output node F high and the complementary output node $\overline{F}$ low. Since the output node F is tied to the gate of transistor $Q_{15}$, the level which appears at output node F when the flip flop is set will appear on the gate of transistor $Q_{15}$, turning it on and providing a discharge path for the high level on the storage node $N_{11}$ through transistor $Q_{16}$, which was turned on when the clock signal $\phi_1$ went high. When the storage node $N_{11}$ goes low, it turns off transistor $Q_{13}$, thereby disconnecting at least temporarily the set trigger circuit from the flip flop. So long as the first clock signal $\phi_1$ remains high, or goes low and remains low, the flip flop will not be affected by the first clock function. Thus, until such time as the first clock signal $\phi_1$ makes another low to high logic level transition, the flip flop will be in a condition to be triggered by other clocked functions without any interaction from the first clocked function.

A second clocked function will now be described, namely set signal $S_2$ and reset signal $R_2$ clocked by complementary clock signals $\phi_2$ and $\overline{\phi}_2$. At time $T_2$ shown in FIG. 2, for example, $\phi_2$ is low and its complement $\overline{\phi}_2$ is high and the reset trigger circuit of the second clocked function is energized by $R_2$ going high and $S_2$ going low. When $R_2$ goes high, the high logic level is transmitted to storage node $N_{22}$ through transfer transistor $Q_{22}$, which is turned on by $\overline{\phi}_2$ being high. Transistor $Q_{24}$ is turned on, but since $\phi_2$ is low, transistor $Q_{29}$ is off and the output node F remains high. Since $\overline{F}$ is low, transistor $Q_{27}$ is off and transistor $Q_{28}$ is also off because $\phi_2$ is low.

The above conditions prevail until time $T_3$ when the second clock signal $\phi_2$ goes high. At this time transistor $Q_{29}$ turns on and so does transistor $Q_{28}$. Because transistors $Q_{29}$ and $Q_{24}$ are both on, the output node F goes low and its complement output node $\overline{F}$ goes high. Transistor $Q_{27}$ turns on when $\overline{F}$ goes high and the high level on storage node $N_{22}$ is discharged through turned on transistors $Q_{27}$ and $Q_{28}$. When node $N_{22}$ goes low, it turns off transistor $Q_{24}$ and temporarily disconnects the second trigger circuit from the flip flop until such time as the second clock signal $\phi_2$ makes its next low to high logic level transition. Before that occurs, however, the flip flop can be triggered by another clocked function without interference from the second clocked function.

For example, let the next clocked function be a set function clocked by the second clock signal $\phi_2$. At time $T_4$, $\phi_2$ goes low and its complement $\overline{\phi}_2$ goes high. Transistors $Q_{20}$ and $Q_{29}$ turn off and the logic levels appearing at the output nodes F and $\overline{F}$ remain the same. The state of the flip flop does not change.

At time $T_5$, set signal $S_2$ goes high and reset signal $R_2$ goes low. When $S_2$ goes high and $\overline{\phi}_2$ is still high, the high level of $S_2$ is transferred through the transfer transistor $Q_{21}$ to storage node $N_{21}$, turning on transistor $Q_{23}$ and thereby conditioning the trigger circuit for triggering by the next low to high logic level transition of the second clock signal $\phi_2$.

At time $T_6$, $\phi_2$ goes high, turning on transistor $Q_{20}$. The high level then appearing on output node $\overline{F}$ discharges through transistors $Q_{20}$ and $Q_{23}$, so node $\overline{F}$ goes low and node F goes high. The high level on the storage node $N_{21}$ discharges through transistors $Q_{25}$ and $Q_{26}$, which are turned on respectively by the high level fed back from output node F to transistor $Q_{25}$ and by the high level of the clock signal $\phi_2$ applied to transistor $Q_{26}$. When storage node $N_{21}$ goes low, transistor $Q_{23}$ turns off, thereby disconnecting the second clocked function from the flip flop until the next low to high logic level transition of the second clock signal $\phi_2$.

What is claimed is:

1. An edge triggered flip flop capable of operating with multiple clocked functions, comprising
   (a) a flip flop,
   (b) a plurality of trigger circuit means coupled in common with said flip flop and in parallel with each other for controlling said flip flop, each of said trigger circuit means having a clock input responsive to a different clock signal and at least one of a set input and a reset input and coupled to said flip flop so that, during the application of a set signal to said set input, the occurrence of a first low to high logic level transition of a clock signal applied to said clock input will set the flip flop to one state and during the application of a reset signal to said reset input, the occurrence of a second low to high logic level transition of said clock signal will set said flip flop to another state opposite to said one state, and
   (c) means coupled between said flip flop and each of said trigger circuit means to temporarily disconnect each said trigger circuit means from said flip flop during the time period between two successive low to high logic level transitions of the respective clock signal, whereby said flip flop can be controlled during said time period by coupling another trigger circuit means to said flip flop.

2. The invention according to claim 1 wherein said flip flop has two complementary output nodes and wherein each of said trigger circuit means includes a first trigger circuit connected to one of said output nodes for setting said flip flop and a second trigger circuit connected to the other one of said output nodes for resetting said flip flop.

3. The invention according to claim 2, wherein said first trigger circuit includes a first transistor responsive to said clock signal and a second transistor in series with said first transistor and responsive to said set signal, and wherein the means in (c) includes transistor switch means responsive to the logic level at said other one of said output nodes for deactivating said second transistor after said flip flop is placed in its set state.

4. The invention according to claim 3, wherein said second trigger circuit includes a third transistor responsive to said clock signal and a fourth transistor in series with said third transistor and responsive to said reset signal, and wherein the means in (c) includes transistor switch means responsive to the logic level at said one output node for deactivating said fourth transistor after said flip flop is placed in its reset state.

5. The invention according to claim 2 wherein said first trigger circuit includes a first MOS transistor having its drain connected to said first output node and a gate coupled to said clock signal, a second MOS transistor connected in series with the source of said first MOS transistor, a MOS transfer transistor having a drain for receiving said set signal and a source connected to the gate of said second MOS transistor at a common storage node, and two serially connected MOS discharge transistors connected to said common storage node for discharging the logic level on said common storage node after said flip flop has been placed in its set state, one of said MOS discharge transistors having its gate connected to the other one of said output nodes and the other one of said MOS discharge transistors having its gate coupled to said clock signal.

6. An edge triggered flip flop capable of operating with multiple clocked functions, comprising:

(a) a flip flop having first and second complementary output nodes, (b) a plurality of clocked functions coupled in common with said flip flop to said output nodes and in parallel with each other, each of said clocked functions including trigger circuit means for controlling said flip flop independently of the other clocked functions and having a clock input and at least one of a set input and a reset input, each trigger circuit means being coupled to said flip flop so that during the application of a set signal to the set input of any one selected trigger circuit means the occurrence of a first low to high logic level transition of a clock signal applied to the clock input of said selected trigger circuit means will set the flip flop to one state and during the application of a reset signal to the reset input of the selected trigger circuit means, the occurrence of a second low to high logic level transition of said clock signal will set said flip flop to another state opposite to said one state, and (c) means associated with each of said clocked functions and coupled between said flip flop and the trigger circuit means of each clocked function to temporarily disconnect said flip flop from each clocked function during the interval between two successive low to high logic level transitions of the same clock signal for that particular clocked function, whereby during said interval when said particular clocked function is thereby temporarily disconnected, the flip flop can be controlled by a low to high logic level transition of the clock signal from a different one of said clocked functions.

7. The invention according to claim 6 wheren said trigger circuit means and said flip flop are integrated with MOS transistors.

8. The invention according to claim 7 wherein said trigger circuit means and said flip flop are integrated with N-channel silicon gate depletion load MOS transistor circuitry.

* * * * *